United States Patent [19]
Marrocco, III et al.

[11] Patent Number: 5,889,141
[45] Date of Patent: Mar. 30, 1999

[54] PHOTOIMAGEABLE COMPOSITIONS COMPRISING POLYQUINOLINE POLYMER AND DIAZO COMPOUND

[75] Inventors: Matthew L. Marrocco, III, Santa Ana, Calif.; Makoto Kaji, Hitachi, Japan

[73] Assignee: Hitachi Chemical Co., Ltd., Tokyo, Japan

[21] Appl. No.: 845,903

[22] Filed: Apr. 28, 1997

[51] Int. Cl.⁶ .................................................... C08G 73/06
[52] U.S. Cl. ..................... 528/423; 528/125; 528/491; 528/492; 528/493; 528/495; 528/502 D; 427/457; 427/372.2; 427/407.1; 430/141; 430/149
[58] Field of Search ...................... 528/125, 423, 528/491, 492, 493, 495, 502 D; 427/457, 372.2, 407.1; 430/141, 149

[56] References Cited

U.S. PATENT DOCUMENTS

| | | |
|---|---|---|
| 3,756,982 | 9/1973 | Vorshak ................................ 268/41 R |
| 4,000,187 | 12/1976 | Stille ............................................ 260/50 |
| 4,507,462 | 3/1985 | Stille ............................................ 528/125 |
| 5,017,677 | 5/1991 | Stille ............................................ 528/125 |
| 5,247,050 | 9/1993 | Hendricks ................................ 528/125 |
| 5,723,573 | 3/1998 | Morrocco, III et al. ............... 528/423 |

OTHER PUBLICATIONS

Chem Abstract 126: 310,450 Photosensitive resin composition and heat resistant relief polymer pattern formation (Keji et al.).

Primary Examiner—Duc Truong
Attorney, Agent, or Firm—Antonelli, Terry, Stout & Kraus, LLP

[57] ABSTRACT

Photoimageable polyquinoline compositions comprise a polyquinoline polymer, a diazonaphthoquinone and optionally a photosensitizer. The composition is prepared by dissolving the polyquinoline polymer, diazonaphthoquinone and photosensitizer in a solvent to form a solution, coating the solution onto a substrate and thereafter removing the solvent to form a film. The film is exposed to light through a photomask and developed by immersion in a selective solvent to yield a photopatterned dielectric film.

60 Claims, 3 Drawing Sheets

FIG. 4

PHOTOIMAGEABLE COMPOSITIONS COMPRISING POLYQUINOLINE POLYMER AND DIAZO COMPOUND

FIELD OF THE INVENTION

This invention relates to photoimageable compositions comprising a polyquinoline polymer or copolymer having chemically attached diazo groups or mixtures of a polyquinoline polymer or copolymer and a diazo compound, and methods for photoimaging said compositions.

BACKGROUND OF THE INVENTION

Polymer dielectrics have a great deal of potential in the electronics industry. They are generally cheaper and easier to work with than the corresponding inorganic materials. In addition, newer ultra-high density, high-speed circuity such as multichip modules (MCM) and chip-on-board (COB) printed circuit boards and new uses in liquid crystal displays (LCD's) require higher levels of performance than existing inorganic dielectrics can provide. There is also a desire to replace inorganic dielectrics with organic materials in integrated circuit (IC) applications because of the performance advantages that organic materials offer. While polymers have had little success in displacing established inorganics such as $SiO_2$ in the semiconductor industry, the potential performance and cost advantages that organic systems offer are driving IC manufacturers to consider them for future generations of semiconductor products. However, despite the potential that organic materials offer, their widespread usefulness has been hindered by the lack of appropriate organic materials with the right combination of properties for these applications.

Polymers are needed with thermooxidative and thermomechanical stability sufficient to withstand 300°–350° C. processing steps, moisture absorptions in the 0.1–1% regime, thermal expansion characteristics which match inorganic substrates (and therefore exhibit low residual stress), and dielectric constants below 3.0. Low dielectric constant materials are especially important for the construction of future signal processing devices which are projected to have clock speeds operating at frequencies within the GHz-range. The new dielectrics must form uniform, high-quality coatings, exhibit excellent resistance to dissolution and crazing by common processing solvents, and show good adhesion to inorganic and metallic substrates. An ideal material would also be easy to process (e.g., spin coat reproducibly, with a minimum of effort) and exhibit excellent long-term stability in solution. This highly demanding combination of properties is not currently available in any commercial product.

Polyimides are the current "state-of-the-art" organic dielectric coatings for microelectronic packaging. Although polyimides exhibit some of the aforementioned attributes, they are not an ideal class of polymers for electronic applications. Some of the drawbacks inherent in polyimides may be attributed to the highly polar carbonyl groups, four of which are present in the repeat unit of typical polyimides. These carbonyls are believed to be responsible for the tendency of polyimides to absorb water, generally at values between 1% and 2% of their weight. Water absorption has a significant deleterious effect on the electrical properties of polyimides, e.g., increased dielectric constant and dielectric loss. In addition, the polarizable nature of the carbonyls is responsible for the relatively high dielectric constants exhibits by polyimides, when compared to less polar polymers.

Another drawback to polyimides for electronic coating applications is that they are usually marketed in a prepolymer form, typically as a polyamic acid solution. These lacquers are applied by spin coating followed by thermal imidization. Polyamic acid solutions are inherently unstable and the viscosities of these solutions can change unless great care is taken during their storage and transport, making the goal of obtaining reproducible spun-on polyimide coatings more difficult. In addition, the imidization process involves the evolution of small molecules (usually water) and significant changes in the chemical structure of the polymers occur. Thus, the conversion of the prepolymer to the final polymer undoubtedly contributes to the high degrees of residual stress often observed at the interface between silicon substrates and polyimide coatings.

The achievement of very low dielectric constants coupled with low moisture uptake in thermally stable polymers suitable for use as organic dielectrics requires polymers that are less polar than polyimides. A particularly well-suited class of polymers for this purpose are polyquinolines. Polyquinolines were developed by John K. Stille, whose research group demonstrated the synthesis of dozens of polyquinoline derivatives.

The quinoline group itself has very high thermal stability. When combined with other thermally stable groups, examples of which include phenyl, phenylene, phenoxy, oxy, diphenylmethylene, hexafluoroisopropylidene, 9,9'-fluorenylidene, dimethylsiloxy, diphenylsiloxy, methylphenylsiloxy, or thio, highly thermally stable polymers result. High thermal stability is useful for producing parts, films, fibers, and other objects which must withstand hot environments, including engine components, supersonic aircraft structures, and electronic components subjected to soldering temperatures or high temperature processing such as in integrated circuit manufacture.

Polyquinolines typically have excellent electrical properties, including low dielectric constants, and low moisture absorption. Polyquinolines are therefore useful as electrical insulators, or dielectrics as for example in printed wiring boards, multichip modules, integrated circuits, electrical connectors, capacitors, wire coating and the like. Polyquinolines having good thermal stability and excellent electrical and mechanical properties are disclosed in U.S. Pat. Nos. 4,000,187 and 5,017,677 to Stille and 5,247,050 to Hendricks and in J. K. Stille, *Macromolecules*, 1981, 14, 870, all of which are incorporated herein by reference.

Figure 1:
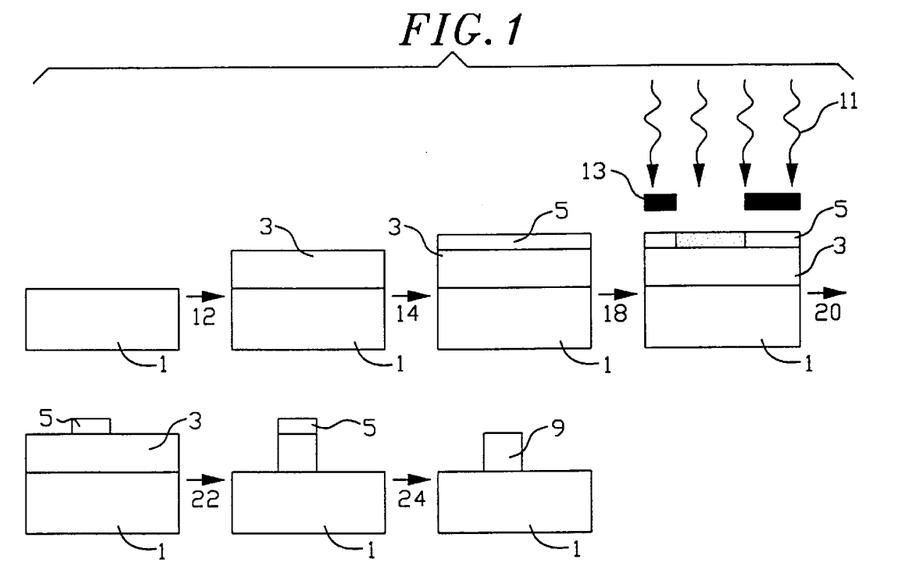
FIG. 1 is a diagram showing the principal process steps in a photolithographic process utilizing a non-photoimageable dielectric.
Figure 2:
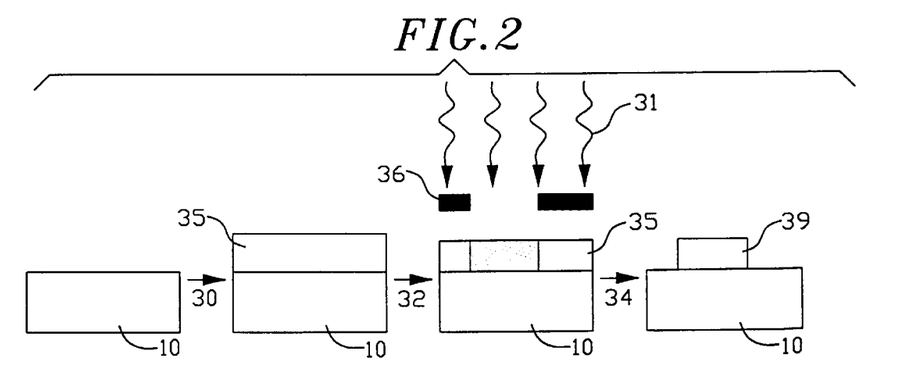
FIG. 2 is a diagram showing the principal process steps in a photolithographic process utilizing a photoimageable dielectric.

For many electronics applications it is necessary to apply a layer of dielectric material in a specific pattern. Polyquinolines may be patterned by photolithography using techniques known for patterning other polymers, such as polyimides. The photolithographic process is capable of yielding very fine features, however, it is a complex process, and therefore costly. The total yield is the product of the yield of each individual step, so that fewer steps are always desired. Many steps in the photolithographic process can be eliminated if the material to be patterned is itself photosensitive, and a separate photoresist is not necessary. FIGS. 1 and 2 contrast the processing steps that are needed to wet etch non-photoimageable dielectrics with those needed to wet etch photoimageable dielectrics.

In FIG. 1 a substrate 1 is coated with a dielectric 3 in process 12. A photoresist 5 is coated on top of the dielectric 3 in process 14. The photoresist is exposed in process 18 by irradiating with light of a suitable frequency 11 through a mask 13. The resist is developed in process 20. The underlying dielectric 3 is etched in process 22. Finally the resist is stripped in process 24 to give patterned dielectric 9. In many cases additional steps are needed. A barrier layer may be needed between the resist and dielectric layer adding a step to process 14. This barrier layer must be etched and stripped adding one step each to processes 20 and 24.

FIG. 2 shows the corresponding steps for a photoimageable dielectric. A substrate 10 is coated with a photoimageable dielectric 35 by process 30. The photoimageable dielectric 35 is exposed in process 32 by irradiating with light of suitable frequency 31 through a mask 36. The photoimageable dielectric 35 is developed in process 34 to give patterned dielectric 39.

As can be seen, photoimageable dielectrics greatly simplify the process of fabricating circuits in multichip module, integrated circuit, liquid crystal display, and other microelectronic applications. Accordingly, it would be desirable to provide a photoimageable polyquinoline containing dielectric composition which could be photopatterned without the extra steps required by non-photoimageable dielectrics.

SUMMARY OF THE INVENTION

The present invention provides a polyquinoline-containing dielectric composition which is photoimageable. The composition comprises a polyquinoline polymer and a diazonaphthoquinone unit (also referred to herein as a "diazo unit" or "DAN unit").

The concentration of DAN unit in the composition is from about 1 mol % to about 100 mol %, preferably from about 10 mol % to about 90 mol % and more preferably from about 20 mol % to about 80 mol % based on the molar concentration of quinoline repeat units. The composition may further comprise a photosensitizer to increase the photospeed of the composition. The photosensitizer is present in an amount of from about 0.001% to about 20%, preferably from about 0.01% to about 10% and more preferably from about 0.1% to about 1% by weight of the polyquinoline.

In one embodiment of the invention, the polyquinoline-containing photoimageable composition is prepared by dissolving the polyquinoline polymer, DAN unit and optionally, the photosensitizer, in a solvent, typically a polar solvent. Preferred solvents include amide solvents, ester solvents, ketone solvents, phenol and alkylphenol solvents and formic acid. The polyquinoline polymer is preferably added to a concentration of about 0.1% to about 60% by weight, more preferably from about 1% to about 30% by weight and even more preferably from about 5% to about 25% by weight of the solution.

In another embodiment of the invention, the DAN unit is chemically bonded to the polyquinoline, either as a side chain to the polyquinoline polymer backbone or as an endcapper to the polyquinoline polymer. This is preferably achieved by reacting the polyquinoline polymer with the sulfonyl chloride or alkyl halide derivative of the desired DAN.

Once a solution of the polyquinoline/DAN composition is achieved, the solution is coated onto a substrate by any suitable method. The solvent is thereafter removed by heating, vacuum or the like, to leave a photoimageable polyquinoline-containing film.

The photoimageable film is thereafter patterned in a photolithographic process by first exposing the film to light having a frequency or wavelength which activates the photoactive components, in a specific pattern, e.g., through a photomask. The film and substrate are then immersed in a selective solvent, which dissolves either the exposed or unexposed areas of the film, but not both. Thereafter, the patterned film is preferably washed with a selected solvent to extract photoactive components and then dried.

DETAILED DESCRIPTION OF THE INVENTION

It has been found that polyquinoline polymer-containing compositions can be made photosensitive and photoimageable through the incorporation of a DAN unit, either as a chemically attached group or as a separate compound blended with the polyquinoline polymer. As used herein, "DAN unit" refers to both DAN compounds which are not chemically bonded to the polyquinoline polymer and to DAN groups which are chemically bonded to the polyquinoline polymer.

Specifically, it has been found that the combination of a polyquinoline polymer and a DAN unit, whether in a blend or chemically combined, form a negative photoresist. That is, a film comprising polyquinolines and a DAN unit, on exposure to light, becomes less soluble in certain solvents. When exposed to light through an appropriate photomask, and developed, a negative image of the photomask is produced in the polyquinoline/DAN film.

Polyquinolines useful in the practice of the present invention may be any polymer having quinoline repeat units, such as those described in U.S. Pat. Nos. 4,000,187 or 5,017,677 both to Stille, 5,247,050 to Hendricks, and in J. K. Stille, *Macromolecules*, 1981, 14, 870–880 ("Stille article"), all of which are incorporated herein by reference.

U.S. Pat. Nos. 4,000,187 and 5,017,677 describes the preparation of polyquinoline homopolymers by the Friedlander condensation polymerization reaction of what are commonly referred to as "type AA" and "type BB" monomers. Type AA monomers are aromatic amino carbonyl monomers containing two sets of ortho-amino carbonyl functions attached to an aromatic nucleus. Particularly useful type AA monomers are selected from the group consisting of compounds represented by the formulas:

wherein R is hydrogen or an aryl, Ar is a tetravalent aromatic group in which the positions of attachment of each set of carbonyl and amino functions are ortho, Ar' is a divalent aromatic group in which the positions of attachment of the carbonyl and amino functions are ortho, Ar" is a divalent aromatic group. As described in U.S. Pat. No. 5,017,677, the Ar substituent of the general formulas (1) and (2) for the type AA compounds can be any aromatic nucleus in which the positions of attachment of each set of carbonyl and amino functions are ortho, including a single aromatic nucleus and a polycyclic aromatic nucleus.

The Ar substituent can be any tetravalent aromatic group in which the positions of attachment of each set of carbonyl and amino functions are ortho, including a single aromatic nucleus, a polycyclic aromatic nucleus and a polynuclear aromatic group. Examples of the Ar substituent include, but are not limited to, tetravalent aromatic groups of 6 to 26 carbon atoms, such as the following groups:

(3)

When the R substituent of the type AA compounds defined by the general formula (1) is aryl, Ar is most commonly tetravalent phenyl (ph).

The substituent Ar' is any divalent aromatic group in which the positions of attachment of the carbonyl and amino functions are ortho. Examples of the substituent Ar' include, but are not limited to, divalent aromatic groups of 6 to 12 carbon atoms, such as the following groups:

(4)

The substituent Ar" in the general formula (2) for the type AA compounds may be any divalent aromatic group, such as a divalent aromatic group of 5 to 26 carbon atoms, and one or more carbons on the aromatic nuclei may be substituted by other atoms, such as N. Examples of the Ar" substituent include, but are not limited to, the following groups:

(5)

The symbol G represents a divalent group selected from the group consisting of an alkylene, such as an alkylene of 1 to 12 carbon atoms, an arylene, such as an arylene of 6 to 12 carbon atoms, an aralkylene, such as an aralkylene of 7 to 14 carbon atoms, an alkarylene, such as an alkarylene of 7 to 10 carbons, an alkylenedioxy, such as an alkylenedioxy of 1 to 12 carbon atoms, an arylenedioxy, such as an arylenedioxy of 6 to 12 carbon atoms, —O—, —CO—, —S—, —SO—, —SO$_2$—, a dialkylsilicon group, such as a dialkylsilicon of 1 to 5 carbon atoms per alkyl group, a diarylsilicon group, such as a diarylsilicon of 6 carbon atoms per aryl group, a divalent group having the following structure:

(6)

a divalent group having the following structure:

(7)

and a cardo group, such as the following groups:

(8)

Type BB monomers are bis methylene ketone monomers selected from the group consisting of compounds represented by the formulas:

(9)

and (10)

and (11)

and (12)

and wherein R is hydrogen or a $C_6$ to $C_{12}$ aryl, including but not limited to phenyl, tolyl, naphthyl and biphenyl, R' is a $C_6$ to $C_{12}$ aryl, including but not limited to phenyl, tolyl, naphthyl and biphenyl, Ar" is a divalent aromatic group, and Ar'" is a tetravalent aromatic group, four positions of which (13)

are occupied by connection of the methylene carbonyl functions. The Ar" of the type BB compounds is the same as the Ar" of the type AA compounds. When the substituent R' or R of the type BB compounds is aryl, Ar" is most often phenylene.

The substituent Ar'" is a tetravalent aromatic group, such as a tetravalent aromatic group of 10 to 12 carbon atoms, and may be two divalent aromatic groups not already joined together or a single tetravalent group, e.g., a fused ring structure or bicyclic structure already joined some way. Examples of the Ar'" substituent include, but are not limited to, the following groups:

(14)

The Stille article reports that related polyquinoline polymers can be prepared from the reaction of monomers, referred to as "type AB" monomers, selected from the group consisting of aromatic compounds containing one set of ortho-amino carbonyl functions, as well as one methylene ketone function attached to an aromatic nucleus. Such monomers are represented by the formulas:

(15)

or (16)

-continued or (17)

wherein R is hydrogen or an aryl, R' is an aryl, Ar' is a divalent aromatic group in which the positions of attachment of the carbonyl and amino functions are ortho, Ar" is a direct bond or a divalent aromatic group, and Ar"" is a trivalent aromatic group in which the positions of attachment of the set of carbonyl and amino functions is ortho.

The Ar' and Ar" of the type AB compounds are the same as the Ar' and Ar" described above with respect to type AA and BB compounds.

The substituent Ar"" is a trivalent aromatic group in which the positions of attachment of the set of carbonyl and amino functions is ortho. Examples of the substituent Ar"" include, but are not limited to, trivalent aromatic groups of 6 to 26 carbon atoms, such as the following groups:

(18)

When the substituent R or R' of the AB compounds is aryl, Ar"" most often is a trivalent benzene group.

U.S. Pat. No. 5,017,677 describes the preparation of a polyquinoline copolymer composition which comprises the reaction product of various mixtures of type AA, type BB and type AB monomers.

U.S. Pat. No. 5,247,050 discloses fluorinated polyquinoline polymers in which the repeating units comprise one or more quinoline groups and at least a portion of the repeating units include a hexafluoroisopropylidene (6F) group or a 1-aryl-2,2,2-tri-fluoroethylidene (3F) group or both. Such polymers tend to be more soluble in common organic solvents, have lower dielectric constants, and lower moisture absorption yet maintain or exceed the thermal stability normally associated with prior art polyquinoline polymers.

One particularly preferred class of polyquinoline polymers, useful in the practice of the present invention, is shown below.

wherein Y is a divalent radical selected from the group consisting of nil, —O—, —N(H)—, —S—, carbonyl, i.e., (20)

sulfone, i.e., (21)

6F, (22)

3F, (23)

hexafluoroisopropylidene diphenoxy, (24)

1-aryl-2,2-trifluoroethylidene diphenoxy, (25)

phenylene, and

(26)

phenylenedioxy,

(27)

isopropylidene, isopropylidene diphenoxy, aryl ethylidene and aryl ethylidene diphenoxy, wherein F in the above formulas can be substituted with H and wherein R' is as defined previously.

Other particularly preferred polyquinoline polymers useful in the practice of the present invention include:

(28)

wherein X' is H or F, and

The number average molecular weight (M$_n$) of the polyquinoline polymers can be from about 1,000 to about 500,000, preferably from about 10,000 to about 100,000, more preferably from about 25,000 to about 75,000. The polyquinoline used in the examples herein has an M$_n$ of about 40,000.

The polyquinoline may be prepared by any method known in the art including, but not limited to, Friedlander condensation polymerization as described, for example, in U.S. Pat. Nos. 4,000,187 or 5,247,050, and nucleophilic polymerization as described in U.S. patent application Ser. No. 08/469,993 filed Jun. 6, 1995 now U.S. Pat. No. 5,648,448, which is incorporated herein by reference.

In Friedlander condensation polymerization the monomers are mixed with a suitable acidic or basic catalyst and solvent and heated for a time and at a temperature sufficient to effect polymerization. The best catalysts were reported by Stille to be diarylphosphates, particularly di-meta-cresyl phosphate and diphenylphosphate and the best solvent was reported to be m-cresol. J. K. Stille, *Macromolecules*, 1981, 14, 870–880.

In an application entitled "Alkyl Phosphate Catalyst for Polyquinoline Synthesis" to M. Marrocco, filed concurrently herewith, the disclosure of which is incorporated herein by reference, there is described the use of alkyl phosphates, particularly dibutyl acid phosphate, as catalyst for the Friedlander condensation polymerization of monomers to form polyquinoline polymers.

As described in application Ser. No. 08/469,993 now U.S. Pat. No. 5,648,448, polyquinoline polymers can also be formed by nucleophilic polymerization. As described therein, polyquinoline polymers can be formed by providing a monomer having two fluoro groups, where each such fluoro group is activated by a quinoline nucleus, a diol monomer provided in the form of its bis-oxide salt, or in the presence of a base capable of deprotonating the diol and reacting the difluoro and diol monomers together in a dipolar solvent. Alternatively polyquinoline polymers can be formed by reacting a fluoro hydroxy monomer comprising a quinoline nucleus containing one activated fluoro group and one hydroxy group in the presence of a base and a dipolar solvent to form said polymer or by treating the monomer with a base to form an oxide salt and reacting the monomer salt in a dipolar solvent to form the polymer.

The DAN or "diazo" unit may be or may be derived from any diazonaphthoquinone. A particular type of diazonaphthoquinone useful for the practice of the present invention is shown below:

where D may be H, alkyl groups having from 1 to about 26 and preferably 1 to about 12 carbon atoms, aryl groups having from about 6 to about 30 and preferably 6 to about 24 carbon atoms (examples of which include phenyl, naphthyl, (o-, m-, p-)tolyl and (o-, m-, p-)anisyl), alkoxy groups having from 1 to about 26 and preferably 1 to about 12 carbon atoms, aryloxy groups having from about 6 to about 30 and preferably about 6 to about 24 carbon atoms (examples of which include phenyloxy, naphthyloxy, (o-, m-, p-)tolyloxy and (o-, m-, p-)anisyloxy), —COX, or —SO$_2$X, where X is —OH, alkoxy having from 1 to about 26 carbon atoms, aryloxy groups having from about 6 to about 30 carbon atoms, Cl, or Br, and R may be on any of positions 3–8 of the naphthoquinone. The naphthoquinone may be substituted by one or more independently selected D groups.

Diazonaphthoquinones may be substituted at the 5 position with a sulfonic ester, as for example in the structure shown below.

Diazonaphthoquinones useful for the practice of the present invention may be dimers or multifunctional with the general structure:

where W is a divalent group selected from nil, divalent alkyl (alkanediyl) groups having from 1 to about 26 and preferably 1 to about 12 carbon atoms, arylene groups having from about 6 to about 30 and preferably from about 6 to about 24 carbon atoms (examples of which include 1,4-phenylene, 1,3-phenylene, 4,4'-biphenylylene, 3,3'-biphenylylene, 4,4'-oxybiphenylylene, 3,3'-oxybiphenylylene, 1,8-naphthylene and 2,6-naphthylene), oxy, esters containing from about 1 to about 24 carbon atoms (examples of which include —O(CO)—, —CH$_2$(CO)— and —O(CO)CH$_2$—), sulfonate esters containing from 0 to about 24 carbon atoms (examples of which include —O(SO$_2$)—, —CH$_2$O(SO$_2$)— and —C$_6$H$_4$—O(SO$_2$)—), thio, sulfones containing from 0 to about 24 carbon atoms (examples of which include —SO$_2$—, —CH$_2$CH$_2$(SO$_2$)CH$_2$CH$_2$— and —CH$_6$(S$_4$O) C$_2$H$_6$—)$_4$, ketones containing from about 1 to about 24 carbon atoms (examples of which include —(CO)—, —C$_6$H$_4$(CO)—, —C$_6$H$_4$(CO)C$_6$H$_4$— and —CH$_2$(CO) CH$_2$—), and amides containing from about 1 to about 24 carbon atoms (examples of which include —NHCO—, —H(CH$_3$)CO—, —N(C$_6$H$_4$)CO—, —C$_6$H$_4$NHCO—, —NHCOC$_6$H$_4$— and —C$_6$H$_4$NHCOC$_6$H$_4$), or catenations of two to eight of these groups.

A more particular general structure for bis-diazo compounds is:

(33)

where Z is chosen from divalent alkyl (alkanediyl) groups and arylene groups as defined above with respect to W.

A particular bis-diazonaphthoquinone, marketed by Molecular Rearrangement, Inc., Newton, N.J., under the trade name Positive Diazo "LL" ("Diazo LL" herein), which is useful in the practice of the present invention is naphthoquinone-(1,2)-diazode-(1)-sulfonic-(5)-naphthodiester which has the following formula:

(34)

Other diazonaphthoquinones useful in the practice of the present invention will be apparent to those skilled in the art.

The photoimageable polyquinoline-containing composition may comprise a simple blend of a polyquinoline polymer and a diazo compound. Alternatively, the diazo compound may be present as an end group on the polyquinoline polymer chain. As another alternative, the diazo compound may be chemically appended onto the polyquinoline polymer backbone.

Photosensitive polyquinoline compositions comprising a blend of polyquinoline polymer and DAN are prepared by dissolving both the polyquinoline and the DAN in a common solvent. Polar solvents usually are required to dissolve the DAN compounds which are salts. Suitable solvents include amide solvents, ester solvents, ketone solvents, phenol and alkylated phenols, and formic acid. Examples of amide solvents include N,N-dimethylformamide, N,N-dimethylacetamide, N-methylpyrrolidinone (also referred to as N-methylpyrrolidone), N-cyclohexylpyrrolidinone, tetramethylurea, and N-methylacetamide. Examples of ester solvents include ethyl acetate, ethyl lactate, propyleneglycol monomethylether acetate. Examples of useful alkylated phenols include meta-cresol, para-cresol, ortho-cresol, and individual and mixed isomers of dimethylphenol. Examples of ketone solvents include cyclopentanone, cyclohexanone, acetone and methylethylketone. Less polar solvents may be used for neutral DAN compounds. It is not necessary for the compound to dissolve completely, and some may remain in suspension; however, a complete solution is preferable.

The polyquinoline concentration in the solution is preferably between about 0.1% and 60% by weight polyquinoline, more preferably between about 1% and 30% by weight polyquinoline, and most preferably between about 5% and 25% by weight polyquinoline. The molar amount of DAN is from about 1 mol % to about 100 mol % based on the molar concentration of quinoline repeat units, preferably about 10 mol % to 90 mol %, and more preferably 20 mol % to 80 mol %.

The mixture is preferably stirred for a time and a temperature sufficient to form a uniform solution of polyquinoline polymer and DAN, preferably for about 1 to 2 hours at a suitable temperature, preferably from about 20° C. to about 100° C.

The DAN may also be attached directly to the polyquinoline polymer backbone through the nitrogen atom of the quinoline units. Since stable complexes may be obtained from reactions between quinoline derivatives and alkyl halides or sulfonyl chlorides, it is possible to attach DAN derivatives bearing these functionalities directly to the quinoline nitrogen atom of polyquinoline polymer. For example, a polyquinoline polymer may be treated with a DAN sulfonyl chloride in a dipolar, aprotic solvent such as tetrahydrofuran (THF) to form the corresponding DAN quinolinium chloride.

(35)

-continued (15)

wherein each Y is as previously defined and may be selected independently and Q is:

(36)

(37)

Alternatively, a polyquinoline polymer may be treated with a DAN alkyl chloride to give an alkyl DAN quinolinium chloride or a DAN derivative with any other functionality capable of quaternizing a quinoline group. DAN alkyl chlorides may be prepared, for example, from DAN sulfonyl chloride and a chlorohydroxyalkane, such as 2-chloroethanol or 3-chloro-1-propanol, using methods well known in the art. Each of these approaches gives a polyquinoline polymer with DAN derivatives covalently attached to the polymer backbone.

The DAN may also be attached to the polyquinoline as an endcapper. In such an embodiment, a sulfonyl chloride or alkyl chloride derivative of DAN is reacted with a polyquinoline polymer having a hydroxyl group at its end as shown below. The preparation of such polyquinoline polymers is described in application Ser. No. 08/469,993, now U.S. Pat. No. 5,648,448.

(38)

wherein R is, for example:

(39)

(40)

Similarly, —NH₂ endcapped polyquinoline may be prepared from —F endcapped polyquinoline and ammonia or hydroxyaniline, which in turn is prepared as described in U.S. patent application Ser. No. 08/469,993 now U.S. Pat. No. 5,648,448, or by Friedlander condensation using a slight excess of ortho-amino ketone monomer.

The solution containing the polyquinoline/DAN blend or reaction product and solvent is filtered if necessary and coated onto a substrate. Any method of coating may be used including spin coating, curtain coating, dip coating, spray coating, brush coating, roller coating and the like. Before coating, the viscosity may be adjusted, e.g., by partial solvent removal, for example, by evaporation due to heating and/or reduced pressure, until a viscosity suitable for the particular coating technique to be used is achieved. The substrate can be any solid surface including, but not limited to, glass, quartz, diamond, silicon, silicon dioxide, tin (IV) oxide ($SnO_2$), aluminum nitride (AlN), alumina, plastics and polymers, metals including aluminum, copper, gold, nickel, titanium and the like and previously patterned layers.

The substrate may be treated using methods known in the art that use adhesion promoters or, where the film is to be removed, with release agents. Adhesion promoters, e.g., aminopropyltriethoxy silane, or other additives, such as dyes, fillers and the like, may be added to the polymer solution before coating.

After coating, the solvent is removed, for example, by oven drying or drying under a vacuum or reduced pressure, the particular conditions, e.g., time, temperature, etc., used depending on the solvent employed, as is well known in the art. For example, typical drying temperatures are from about 40° C. to about 200° C., and preferably from about 50° C. to about 150° C. Drying times typically range from about one minute to about one hour depending on the temperature, drying apparatus and other conditions. Drying may take place at atmospheric pressure or at reduced pressure, as desired. The drying atmosphere may be air or an inert atmosphere such as nitrogen or argon. The film may be optionally removed from the substrate to form a free-standing film, or transferred from a temporary substrate, such as a polyethylene film substrate, to a second substrate. All handling of solutions, films, and intermediate products containing the polyquinolines/DAN system should in the absence of light or under a safe-light which does not activate the DAN.

The polyquinolines/DAN film may then be patterned by exposure to radiation from a light source. Exposure to light in the appropriate wavelength range causes the film to become less soluble in certain solvents and, therefore, to act as a negative photoresist. The mechanism of the functioning of DANs in a polyquinoline system is unclear. It is known that novolac resins containing 10–20 weight percent DAN provide a useful photoresist for microelectronic applications. In that system, it is believed that DAN loses nitrogen upon exposure to light to thereby form a carbene that subsequently rearranges to a ketene. The ketene reacts quickly with absorbed water, in the novolac resin to form an indene acid. This mechanism is shown below.

(41)

Upon formation of the indene acid, the exposed resin becomes hydrophilic and is more soluble in an aqueous developer. Thus, novolac/DAN systems function as positive photoresists.

Unlike novolac/DAN systems, polyquinoline/DAN systems are negative photoresists. Films of polyquinoline/DAN blends are soluble in toluene before exposure and are insoluble after exposure to light. While this mimics the behavior of DAN which are generally soluble in toluene and only slightly soluble after exposure, it is not likely that the DAN is simply inhibiting the solubility of the exposed film since most of the DAN material can be removed in a post-development wash as described below, and the film will remain insoluble in toluene. While not being bound by theory, it is possible that in the present invention DAN does not form an indene acid as it is believed to do in novolac systems since polyquinolines absorb less water than novolac systems (about 0.15% for the polyquinoline of formula 13 where X=F, about 0.25% for the same polymer containing about 17% by weight DAN (Diazo LL) and about 0.5% for typical novolac systems) and because IR spectroscopy of exposed films do not show peaks characteristic of carboxylic acids. For these reasons, it is believed that the photoinduced change in solubility of polyquinoline/DAN systems is a result of a chemical reaction between the polyquinoline polymer and the photoinduced products of the DAN. Where the DAN unit is chemically appended to the polyquinoline backbone, the intermediate carbene and ketene derivatives may also react to form crosslinks, rendering the polyquinoline insoluble in solvent.

In the processing of the photoimageable polyquinoline composition, the choice of light source is very important. Light of a particular wavelength(s) must be used which will be absorbed by the DAN (or photosensitizer if present). Further, the wavelength(s) used are preferably transparent, or nearly transparent to the polyquinoline polymer. Otherwise, it will only reach the top portion of the polyquinoline/DAN film. In some instances, it may be desirable to expose only the upper portion of the film, e.g., to improve resolution by limiting the depth of field.

Light having a wavelength(s) in the range of from about 230 to about 600 nm and preferably 300 to 500 nm is presently preferred. This is because most DANs absorb radiation in this range and most polyquinolines are at least partially transparent to light in this range. It is understood that the specific wavelength(s) selected, whether within the preferred range or not, will be optimized for the absorption properties of the particular polyquinoline polymer, DAN and optionally photosensitizer in the composition. It is further understood that any light source, whether UV, electron beam, X-ray, visible, infrared or the like, which produces light which is absorbed by the DAN and effects a change in solubility in the polyquinoline polymer may be used.

The amount of light energy must be sufficient to induce a change in solubility of the polyquinoline/DAN film to thereby enable it to act as a negative photoresist. It has been found that a four-watt light source providing from about 1 to about 5,000 mJ/cm$^2$ of light energy produces satisfactory results.

Typically the pattern is provided by a photomask. Alternative methods of patterning are exposing selected region with a scanned laser beam, projecting a focused image onto the film, or using the diffraction pattern of a mask to image the film.

Following exposure the film is developed in a selective solvent. A selective solvent is a solvent in which either the exposed area is soluble or the unexposed area is soluble, but not both. On exposure, the solubility of the polyquinoline/DAN composition changes, i.e., it becomes less soluble in non-polar and weakly polar solvents. Hence, non-polar and weakly polar solvents can be used to dissolve the unexposed areas. Non-polar and moderately polar solvents will therefore dissolve the unexposed areas selectively. Examples of selective non-polar or moderately polar solvents include aromatic solvents such as benzene, chlorobenzene, toluene, xylene, anisole, mesitylene, 1,2,4-trimethylbenzene and dioxane, ester solvents such as methyl acetate, ketone solvents such as acetone, alkylketone solvents, alkylamide solvents and the like.

Development may be accomplished by any suitable method as is well known in the art. For example, a dipping method may be used wherein the film is dipped and shaken in the developer. Alternatively, the film may be developed via a puddle method wherein the developer is heaped upon a substrate by using interfacial tension. Another alternative is to apply a spray or mist of the developer onto the film until development is complete. The maximum temperature of the developer depends on its boiling point or vapor pressure. Typically the developer is maintained at a temperature of room temperature to about 50° C. The amount of developer depends on the developing method used, the kind of developer used and the like.

The relative change in solubility depends in part on the initial polyquinoline solubility, the weight fraction of quinoline repeat units in the polyquinoline, the concentration of DAN in the film, the exposure time and temperature and the presence and amount of sensitizer.

A simple procedure for choosing a selective solvent for a given polyquinoline/DAN pair and selected light source consists of exposing sections of a film (on an inert substrate such as glass) of the polyquinoline/DAN for 0, 20, 40, 60, and 80 min, then immersing the exposed film into a test solvent. For a negative photosystem the test solvent should be one which dissolves the unexposed film. The film is observed as it is lightly agitated. The unexposed areas should dissolve first with the areas of longest exposure dissolving last or remaining undissolved. If only the unexposed area dissolves then a set of shorter exposure times should be tried until the shortest time needed to render the exposed areas insoluble is found. Also, if only the unexposed area dissolves it may be desirable to chose a more polar solvent, for example, if the more polar solvent offers advantages in volatility, or toxicity. If all areas dissolve then a less polar solvent should be tried. Rankings of solvents by polarity may be found for example in "The Chemist's Companion," A. J. Gordon, and R. A. Ford, John Wiley & Sons, NY, 1972, or organic chemistry textbooks. If nothing is known about the solubility of the polyquinoline then toluene may be used as the starting solvent.

Sensitizers may be added to the polyquinolines/DAN to increase the photospeed, i.e., to decrease the amount of light needed to render the film insoluble. Many photosensitizers are commercially available. Examples of sensitizers useful in the practice of the present invention include, but are not limited to, phenothiazine, benzo[c]phenothiazine, benzophenone, 4,4'-bis(dimethylamino)benzophenone, xanthone, triphenylene, thioxanthone, anthraquinone, anthracene, 9,10-diphenylanthracene, 9,10-bis (phenylethynyl)anthracene, 2-methoxyanthracene, 1,5-dimethoxyanthracene, 1,8-dimethoxyanthracene, 6-chloroanthracene, 1,5-dichloroanthracene, 5,12-bis(phenylethynyl)naphthacene, chrysene, pyrene, 1,3-dicyanobenzene, phenyl-3-cyanobenzoate, 2-chlorothioxanthane, 2-methylthioxanthane, 2,4-diethylthioxanthane, 7-diethylamino-3-(2-thenoyl) coumarin, 3,3'-carbonyl bis(7-diethylamino coumarin), 7-diethyl amino-3-benzoyl coumarin, 3,3'-carbonyl bis(7-dimethoxy coumarin) and 7-H-benzo[c]phenothiazine.

The amount of sensitizer may be determined by test exposures, measuring the time required under a particular light source to render the polyquinolines/DAN film insoluble at a series of photosensitizer concentrations. The amount of sensitizer is preferably about 0.001% to 20% of the weight of the polyquinolines, more preferably about 0.01% to 10%, and most preferably about 0.1% to 1%. Because the DAN and the photosensitizer are typically relatively high priced materials it is usually desirable to keep their concentration to a minimum. Using the tests outlined above one skilled in the art will be able to formulate an optimum amount of DAN and photosensitizer. In addition, one may wish to alter the polyquinolines, for example, by lowering its molecular weight (MW) which increases solubility of both exposed and unexposed areas. Lowering the MW can be achieved by endcapping or terminating the polymerization after a short time.

Each photosensitizer absorbs light energy in particular frequency ranges, and is therefore effective for different frequencies of light. For example, benzo[c]phenothiazine (BPT) functions as a sensitizer to light between 400 and 430 nm (M. Barra, R. W. Redmond, M. T. Allen, G. S. Calabrese, R. Sinta, and J. C. Scaiano, *Macromolecules* 1991, 24, 4972). The polyquinoline polymer of Example 2 below is transparent to 420 nm light, and thus BPT is expected to work well in this system. Excellent images are obtained when a small amount (≦0.2 wt %) of BPT is incorporated into a blend of MBPS and the polyquinoline of Example 2 and the film is exposed at 420 nm.

The polyquinolines/DAN film may be subjected to baking steps before or after exposure to light, and before or after development. Baking steps can increase sensitivity and resolution. Typical baking steps are heating the film coated substrate to 100° C. for 15 min., or heating to 150° C. for 5 min, or more elaborate heating protocols, holding at more than one temperature, or with controlled rates of heating may be used.

In electronic applications, the photoimageable polyquinoline-containing dielectric remains as part of the electronic device. It is therefor important that undesirable structures be eliminated from the final dielectric. The photoactive materials, e.g. DANS and photosensitizers, if used, introduce polar functionalities and/or aliphatic substituents that may lead to the degradation of the electrical properties and/or thermal stability of the final material. Accordingly, after the polyquinoline/DAN film has been patterned and developed, excess photoactive material and their by-products are preferably removed.

This may be accomplished by contacting the developed film with an appropriate solvent. The particular solvent selected will be one in which the photoactive materials are soluble after exposure to light while the polyquinoline polymer is insoluble. Typically, the photoactive materials will dissolve in any polar solvents such as ethanol, acetone and water whereas polyquinolines do not dissolve in such solvents. For example, Diazo LL is soluble in acetone, both before and after exposure, while polyquinolines (e.g., the polyquinoline of Example 2 is not.

The particular solvent to be used to extract the photoactive materials, along with the time and temperature may be determined by simple trial and error. The effectiveness of a particular solvent extraction system may be evaluated by thermal gravimetric analysis (TGA). This is a conventional test which measures weight loss vs. temperature. It is known that the photoactive materials thermally degrade in air at temperatures lower than that for polyquinolines. Thus, the weight loss before the onset of thermal degradation of the polyquinoline, is indicative of the amount of photoactive material remaining in the dielectric.

The following examples are illustrative of the present invention.

EXAMPLE 1

Preparation of difluoroquinoline monomer bis-6,6'-[2-(4-fluorophenyl)-4-phenylquinoline]

(42)

A three-necked, 2 L round-bottomed flask equipped with a thermometer, a mechanical stirrer, and a distillation unit fitted with a nitrogen inlet valve was charged with 2-amino-5-chlorobenzophenone (695.0 g, 3.00 mol), 4'-fluoroacetophenone (456.0 g, 3.30 mol), and p-tosic acid (47.62 g, 0.25 mol). The reaction mixture was heated under nitrogen at 165° C. (44 h). The yellow 4'-acetophenone that co-distilled with the water was separated and reintroduced to the reaction mixture through the heating period. The mixture was further heated to 190° C. (2 h). The mixture was cooled to 120° C. and poured into 95% ethanol (10 L) while vigorously stirring with a mechanical stirring rod setup. The mixture was filtered and the precipitate washed with ethanol (1 L). The solid, 6-chloro-2-(4-fluorophenyl)-4-phenylquinoline was dried in a vacuum oven at 80° C. (16 h).

A 250 mL, three-necked, round-bottomed flask fitted with a stirring rod set up and a nitrogen inlet was charged with the solid 6-chloro-2-(4-fluorophenyl)-4-phenylquinoline (25.0 g, 75 mmol), bis(triphenylphosphine) nickel dichloride (0.681 g, 1.04 mmol), sodium iodide (1.40 g, 9.37 mmol), triphenylphosphine (8.19 g, 33.3 mmol), and activated zinc dust (3.13 g, 47.9 mmol) and NMP (N-methylpyrrolidinone) (86 mL). The flask was heated under nitrogen to 70° C. (16 h). The mixture was diluted with NMP (10 mL), the temperature was raised to 170° C., and the mixture was filtered hot through Celite. The mother liquor was cooled to −20° C. and the product was collected by filtration. The yellow solid was washed with cold ethanol/methylene chloride (3/1) and was dried in a vacuum oven at 100° C.

EXAMPLE 2
Preparation of a polyquinoline of the structure:

An oven-dried, three-necked, 100 mL round-bottomed flask equipped with a mechanical stirrer, a Dean-Stark trap, and a nitrogen inlet was charged with the difluoro quinoline monomer of Example 1 (2.98 g, 5.0 mmol), hexafluoroisopropylidenebisphenol (bis-phenol AF) (1.68 g, 5.0 mmol), potassium carbonate (1.04 g, 7.5 mmol), anhydrous NMP (20 mL), and toluene (20 mL). The mixture was heated to reflux (ca. 135° C.) under nitrogen (16 h). The toluene was removed, the Dean-Stark trap was replaced by a condenser, and the mixture was again heated at reflux (24 h). The reaction mixture was diluted with NMP (30 mL) and allowed to cool to room temperature. The polymer was precipitated by slowly pouring the solution into distilled water (250 mL). The solid was collected by filtration and dried under vacuum at 130° C. (yield >95%). $M_n$=70,000 by GPC relative to polystyrene standards.

The polyquinoline polymer has a $T_g$ of about 265° C. and is soluble in amide solvents, such as NMP, DMAC, and the like, and in some ether and ester solvents, including cyclopentanone and tetrahydrofuran. The polyquinoline polymer is insoluble in toluene, hexane, diethylether, water, acetone, and alcohols. Heating the polyquinoline polymer to elevated temperatures of about 300° C. for about 1 to 10 hours increases the $T_g$ to about 280° C. and decreases the solubility.

EXAMPLE 3

Polyquinoline Diphenyliodonium Salt Photoimageable Polyquinoline

Blends of the polyquinoline polymer of Example 2 and Diazo LL were prepared. The polyquinoline was dissolved in cyclopentanone to make a 5% by weight solution. To separate portions this solution was added enough Diazo LL to make the solutions having concentrations of Diazo LL of 0.5 weight % (5/0.5 polyquinoline/Diazo LL), 1% by weight (5/1 polyquinoline/Diazo LL), 2% by weight (5/2 polyquinoline/Diazo LL) and 3% by weight (5/3 polyquinoline/Diazo LL). Glass microscope slides were dip coated in the polyquinoline/Diazo LL solutions (two slides per solution) and dried in a convection oven at 80° C. for 1 hour. The plates were partially masked and exposed to either a four-watt 366 or four-watt 420 nm UV light for 30 or 60 minutes. The exposed plates were developed by immersion for approximately 2 minutes in lightly agitated toluene. The results are shown below in Table 1.

TABLE 1

| Polyquinoline/<br>Diazo LL | Exposure<br>Wavelength (nm) | Image Quality | Exposure<br>Time (min) |
| --- | --- | --- | --- |
| 5/0.5 | 366 | Poor | ≧60 |
| 5/1 | 366 | Excellent | 60 |
|  | 420 | Excellent | 60 |
| 5/2 | 366 | Excellent | 60 |
|  | 420 | Excellent | 30 |
| 5/3 | 366 | Excellent | 60 |
|  | 420 | Excellent | 30 |

EXAMPLE 4

Thermal Degradation of Polyquinoline/Diazo LL

Figure 3:
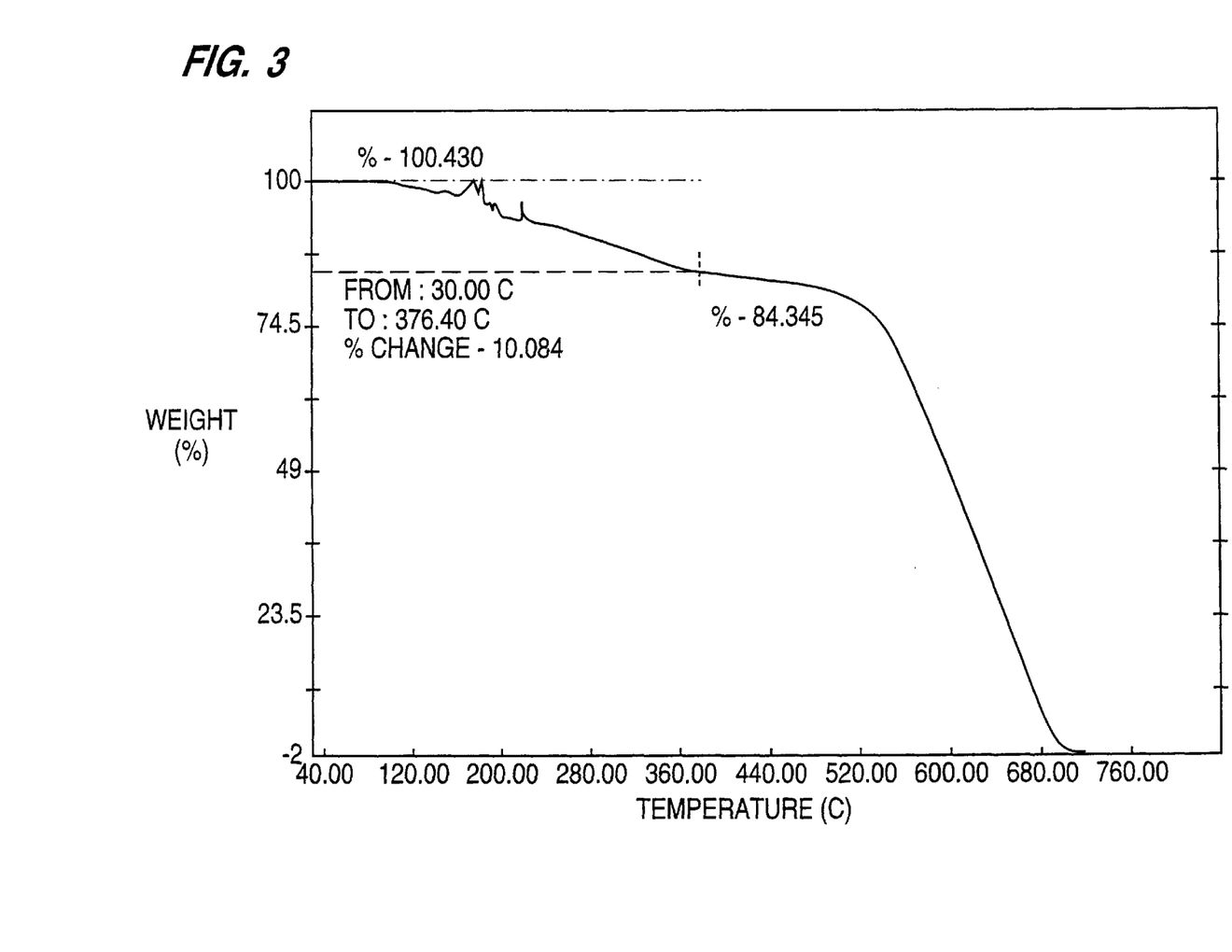
FIG. 3 is a graph showing the results of a thermal gravimetric analysis (TGA) of a polyquinoline/DAN film in which the photoactive components have not been extracted.

A 5/1 polyquinoline/Diazo LL film was prepared according to the method of Example 3 and was dipcoated onto a slide and dried in a convection oven at 80° C. for one hour and then exposed to a four-watt 470 nm UV light for 60 seconds. As shown in FIG. 3, thermal gravimetric analysis performed on a Perkin-Elmer TGA7 with a 20.0° C./min scanning rate with a sample weight of 3.780 mg, shows that at approximately 100° C. the film begins to thermally degrade in air and has lost approximately 16% of its weight before stabilizing at approximately 370° C. It is known that the polyquinoline polymer of Example 2 does not begin to degrade until about 550° C. The 16% weight loss almost exactly matches the 16.6% by weight of Diazo LL which is present in a 5/1 polyquinoline/Diazo LL composition.

EXAMPLE 5
Thermal Degradation of Washed Polyquinoline/Diazo LL

Figure 4:
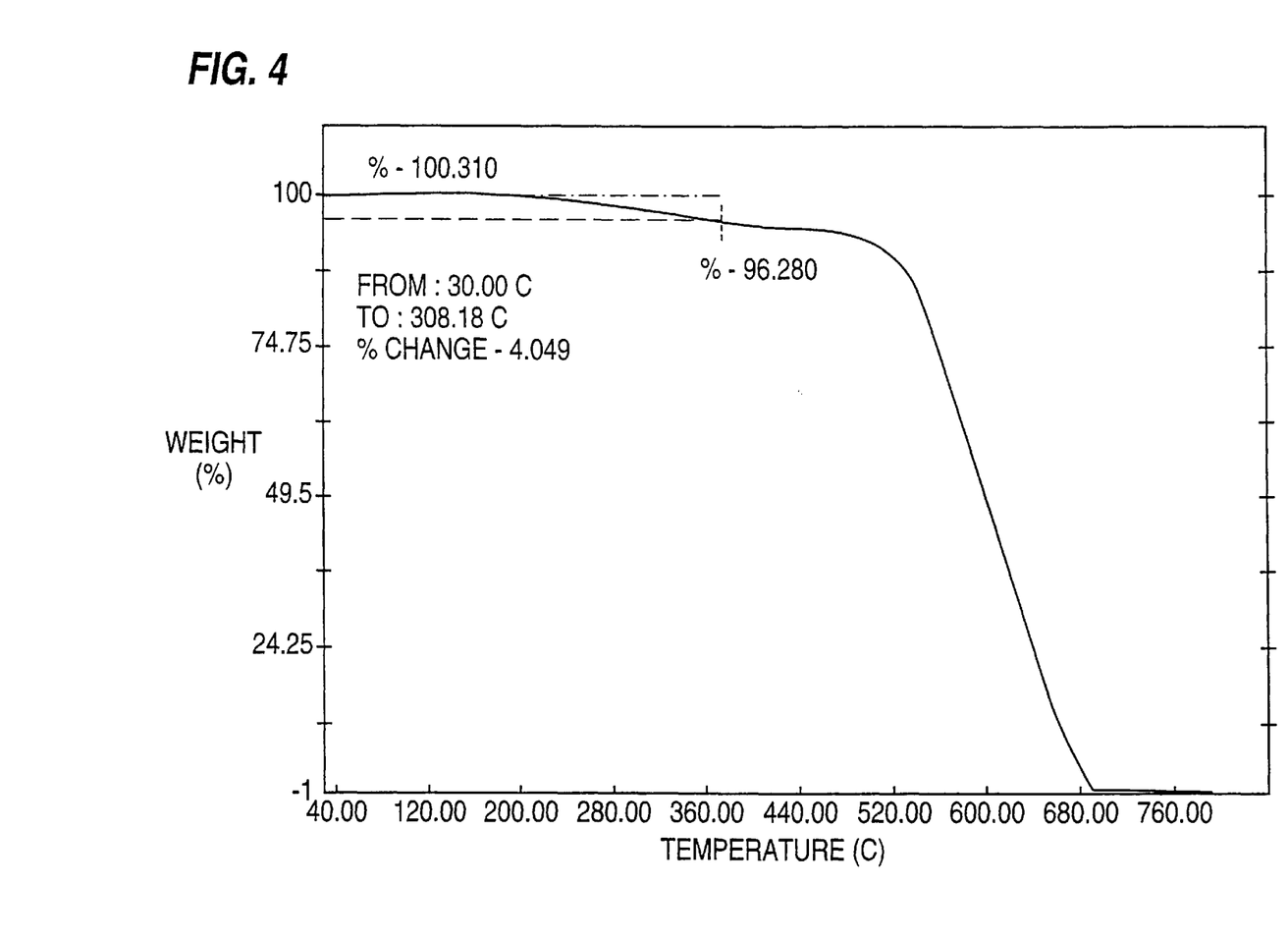
FIG. 4 is a graph showing the results of thermal gravimetric analysis (TGA) of a polyquinoline/DAN film which has undergone a wash to extract photoactive components.

The procedure of Example 4 was repeated except that the exposed film was washed by immersion in acetone for 18 hours at room temperature and thereafter dried in a vacuum oven at 80° C. for two hours. Thermal gravimetric analysis of a 5.055 mg sample (shown in FIG. 4) demonstrate only a 4% weight loss at temperatures up to 360° C. This establishes that approximately 75% of the DAN and DAN products were extracted by the acetone wash.

EXAMPLE 6
Patterning Property of Photoimageable Polyquinoline/DAN Film Photoimageable polyquinoline compositions were prepared with the following components:

Polyquinoline polymer=polyquinoline of Example 2
DAN=

(44)

wherein A=H or A' wherein A' is represented by the following formula:

(45)

wherein the ratio of H/A' is 0.5/3.5.
Sensitizer=

(46)

Solvent=cyclopentanone.

Two polymer solutions were prepared according to the following formulations (percents refer to percents by weight) wherein the same DAN mixture was used in both solutions.

| Solution | Polyquinoline | DAN | Sensitizer |
|---|---|---|---|
| 1 | 5% (solids content) | 1% | — |
| 2 | 5% (solids content) | 1% | 0.02% |

The two solutions were spin coated onto 24 five-inch bare silicon wafers, 12 wafers per solution. The conditions for spin coating were 1000 rpm for 8 seconds and then 2000 rpm for 30 seconds. The coated wafers were then baked on a hot plate for 120 seconds at 80° C. and then another 120 seconds at 80° C. The wafers were then exposed through a contact photomask to light energy at 365 nm of 500, 1000 or 2000 mJ/cm$^2$. The exposed wafers were then developed by dipping in toluene for 10, 30, 45 or 60 seconds and thereafter rinsed by dipping in ethanol for a few seconds. The results are shown in Tables 2 and 3 below.

TABLE 2

Patterning Experiment on Formulation No. 1
After prebaking, film thickness was 2.2–2.4 μm

| Wafer No. | Dev. Time (seconds) | Exposure (mJ/cm$^2$) | Result |
|---|---|---|---|
| 1 | 10 | 500 | Underdeveloped |
| 2 | 10 | 1000 | Underdeveloped |
| 3 | 10 | 2000 | Underdeveloped |
| 4 | 30 | 500 | Underexposed |
| 5 | 30 | 1000 | Rough image |
| 6 | 30 | 2000 | Relatively good pattern |
| 7 | 45 | 500 | Underexposed |
| 8 | 45 | 1000 | Rough image |
| 9 | 45 | 2000 | Relatively good pattern |
| 10 | 60 | 500 | Underexposed |
| 11 | 60 | 1000 | Underexposed overdeveloped |
| 12 | 60 | 2000 | Overdeveloped |

TABLE 3

Patterning Experiment on Formulation No. 2
After prebaking, film thickness was 2.2–2.4 μm

| Wafer No. | Dev. Time (seconds) | Exposure (mJ/cm$^2$) | Result |
|---|---|---|---|
| 13 | 10 | 500 | Underdeveloped |
| 14 | 10 | 1000 | Underdeveloped |
| 15 | 10 | 2000 | Underdeveloped |
| 16 | 30 | 500 | Rough image |
| 17 | 30 | 1000 | Rough image |
| 18 | 30 | 2000 | Relatively good pattern |
| 19 | 45 | 500 | Stripped |
| 20 | 45 | 1000 | Rough image |
| 21 | 45 | 2000 | Relatively good pattern |
| 22 | 60 | 500 | Underexposed |
| 23 | 60 | 1000 | Underexposed overdeveloped |
| 24 | 60 | 2000 | Overdeveloped |

The effect of the sensitizer is shown by the results identified in Tables 2 and 3. For example, with respect to Wafer No. 4, no image was produced. However, as shown by Wafer No. 16, when 0.02% sensitizer was added to the formulation, an image was produced, albeit rough, under the same conditions.

What is claimed is:

1. A photoimageable composition comprising a polyquinoline polymer and a diazonaphthoquinone unit.

2. The composition of claim 1 wherein the amount of diazonaphthoquinone unit is from about 1 mol % to about 100 mol % based on the molar concentration of quinoline repeat units in the polyquinoline polymer.

3. The composition of claim 1 wherein the amount of diazonaphthoquinone unit is from about 10 mol % to about 90 mol % based on the molar concentration of quinoline repeat units in the polyquinoline polymer.

4. The composition of claim 1 wherein the amount of diazonaphthoquinone unit is from about 20 mol % to about 80 mol % based on the molar concentration of quinoline repeat units in the polyquinoline polymer.

5. The composition of claim 1 wherein the diazonaphthoquinone unit is chemically bonded to the polyquinoline polymer.

6. The composition of claim 1 wherein the diazonaphthoquinone unit has the structural formula:

wherein D may be on any of positions 3 to 8 of the naphthoquinone and is selected from the group consisting of H, alkyl groups having from about 1 to about 26 carbon atoms, aryl groups having from about 6 to about 30 carbon atoms, alkoxy groups having from about 1 to about 26 carbon atoms, aryloxy groups having from about 6 to about 30 carbon atoms, COX and $SO_2X$ wherein X is selected from the group consisting of OH, alkoxy, aryloxy, Cl or Br and wherein the naphthoquinone may be substituted by one or more independently selected R groups.

7. The composition of claim 1 wherein the diazonaphthoquinone unit has the following structure:

wherein X is selected from the group consisting of OH, alkoxy, aryloxy, Cl and Br.

8. The composition of claim 1 wherein the diazonaphthoquinone unit has the following structure:

wherein W is selected from the group consisting of nil, divalent alkyl groups having from 1 to about 26 carbon atoms, arylene groups having from about 6 to about 30 carbon atoms, oxy, esters having from 1 to about 24 carbon atoms, sulfonate esters having from 0 to about 24 carbon atoms, thio, sulfones having from 0 to about 24 carbon atoms, ketones having from 1 to about 24 carbon atoms, amides having from 1 to about 24 carbon atoms, and catenations thereof.

9. The composition of claim 1 wherein the diazonaphthoquinone unit has the following structure:

wherein Z is selected from the group consisting of divalent alkyl groups having from 1 to about 26 carbon atoms and arylene groups having from about 6 to about 30 carbon atoms.

10. The composition of claim 1 wherein the diazonaphthoquinone unit has the following structure:

11. The composition of claim 1 wherein the diazonaphthoquinone unit is a mixture of diazo compounds having the structural formula:

wherein A=H or A' and A' is represented by the formula:

and the ratio of H/A' is from about 3.5/0.5 to about 0.5/3.5.

12. The composition of claim 1 where polyquinoline polymer has repeat units having the structure wherein Y is a divalent radical selected from the group consisting of nil, —O—, —N(H)—, —S—, carbonyl, sulfone, hexafluoroisopropylidine, 1-aryl-2,2,2-trifluoroethylidene, hexafluoroisopropylidene diphenoxy, 1-aryl-2,2,2-trifluoroethylidene diphenoxy, phenylene, phenylenedioxy, isopropylidene, isopropylidene diphenoxy, aryl ethylidene, and aryl ethylidene diphenoxy.

13. The composition of claim 1 where polyquinoline polymer has repeat units having the structure 14. The composition of claim 1 where polyquinoline polymer has repeat units having the structure 15. The composition of claim 1 further comprising a photosensitizer.

16. The composition of claim 15 wherein the photosensitizer is present in an amount of from about 0.001% to about 20% by weight of the polyquinoline.

17. The composition of claim 15 wherein the photosensitizer is present in an amount of from about 0.01% to about 10% by weight of the polyquinoline.

18. The composition of claim 15 wherein the photosensitizer is present in an amount of from about 0.1% to about 1% by weight of the polyquinoline.

19. The composition of claim 15 wherein the photosensitizer is selected from the group consisting of phenothiazine, benzo[c]phenothiazine, benzophenone, 4,4'-bis(dimethylamino)benzophenone, xanthone, triphenylene, thioxanthone, anthraquinone, anthracene, 9,10-diphenylanthracene, 9,10-bis(phenylethynyl)anthracene, 2-methoxyanthracene, 1,5-dimethoxyanthracene, 1,8-dimethoxyanthracene, 6-chloroanthracene, 1,5-dichloroanthracene, 5,12-bis(phenylethynyl)naphthacene, chrysene, pyrene, 1,3-dicyanobenzene, phenyl-3-cyanobenzoate, 2-chlorothioxanthane, 2-methylthioxanthane, 2,4-diethylthioxanthane, 7-diethylamino-3-(2-thenoyl) coumarin, 3,3'-carbonyl bis(7-diethylamino coumarin), 7-diethyl amino-3-benzoyl coumarin, 3,3'-carbonyl bis(7-dimethoxy coumarin) and 7-H-benzo[c] phenothiazine.

20. A method for preparing a photoimageable polyquinoline film comprising:

dissolving a polyquinoline polymer and a diazonaphthoquinone unit in a solvent to form a solution;

applying a coating of the solution to a substrate; and removing the solvent from the coated solution to thereby form a photoimageable film.

21. The method of claim 20 wherein the concentration of polyquinoline polymer in the solution is from about 0.1% to about 60% by weight of the solution.

22. The method of claim 20 wherein the concentration of polyquinoline polymer in the solution is from about 1% to about 30% by weight of the solution.

23. The method of claim 20 wherein the concentration of polyquinoline polymer in the solution is from about 5% to about 25% by weight of the solution.

24. The method of claim 20 wherein the solvent is a polar solvent selected from the group consisting of amide solvents, ester solvents, ketone solvents, phenol solvents, alkylphenol solvents and formic acid.

25. The method of claim 20 wherein the amount of diazonaphthoquinone unit is from about 1 mol % to about 100 mol % based on the molar concentration of quinoline repeat units in the polyquinoline polymer.

26. The method of claim 20 wherein the amount of diazonaphthoquinone unit is from about 10 mol % to about 90 mol % based on the molar concentration of quinoline repeat units in the polyquinoline polymer.

27. The method of claim 20 wherein the amount of diazonaphthoquinone unit is from about 20 mol % to about 80 mol % based on the molar concentration of quinoline repeat units in the polyquinoline polymer.

28. The method of claim 20 further comprising dissolving a photosensitizer in the solvent.

29. The method of claim 28 wherein the photosensitizer is present in an amount of from about 0.001% to about 20% by weight of the polyquinoline.

30. The method of claim 28 wherein the photosensitizer is present in an amount of from about 0.01% to about 10% by weight of the polyquinoline.

31. The method of claim 28 wherein the photosensitizer is present in an amount of from about 0.1% to about 1% by weight of the polyquinoline.

32. A method for preparing a photoimageable polyquinoline film comprising:

(a) mixing a polyquinoline polymer and a diazonaphthoquinone unit selected from the group consisting of alkyl halide derivatives of diazonaphthoquinones and sulfonyl chloride derivatives of diazonaphthoquinones, and a solvent at a temperature and for a time sufficient for at least a portion of the diazonaphthoquinone unit to chemically bond to the polyquinoline polymer;

(b) applying a coating of the solution resulting from step (a) to a substrate; and (c) removing the solvent from the coated solution to thereby form a photoimageable film.

33. The method of claim 32 wherein the diazonaphthoquinone unit chemically bonds to the polyquinoline polymer as a side unit.

34. The method of claim 32 wherein the diazonaphthoquinone unit chemically bonds to the polyquinoline polymer as an end unit.

35. The method of claim 32 wherein the polyquinoline polymer has a reactive group selected from the group consisting of OH and $NH_2$ and the diazonaphthoquinone unit reacts with said reactive group.

36. The method of claim 32 wherein the polyquinoline polymer has a reactive end group selected from the group consisting of OH and $NH_2$ and the diazonaphthoquinone unit reacts with said reactive end group to thereby form a diazonaphthoquinone end cap.

37. The method of claim 32 wherein the amount of polyquinoline polymer added in step (a) is from about 0.1% to about 60% by weight of the resulting solution.

38. The method of claim 32 wherein the amount of polyquinoline polymer added in step (a) is from about 1% to about 30% by weight of the resulting solution.

39. The method of claim 32 wherein the amount of polyquinoline polymer added in step (a) is from about 5% to about 25% by weight of the resulting solution.

40. The method of claim 32 wherein the solvent is a polar solvent selected from the group consisting of amide solvents, ester solvents, ketone solvents, phenol solvents, alkylphenol solvents and formic acid.

41. The method of claim 32 wherein the amount of diazonaphthoquinone unit is from about 1 mol % to about 100 mol % based on the molar concentration of quinoline repeat units in the polyquinoline polymer.

42. The method of claim 32 wherein the amount of diazonaphthoquinone unit is from about 10 mol % to about 90 mol % based on the molar concentration of quinoline repeat units in the polyquinoline polymer.

43. The method of claim 32 wherein the amount of diazonaphthoquinone unit is from about 20 mol % to about 80 mol % based on the molar concentration of quinoline repeat units in the polyquinoline polymer.

44. The method of claim 32 further comprising dissolving a photosensitizer in the solvent.

45. The method of claim 44 wherein the photosensitizer is present in an amount of from about 0.001% to about 20% by weight of the polyquinoline.

46. The method of claim 44 wherein the photosensitizer is present in an amount of from about 0.01% to about 10% by weight of the polyquinoline.

47. The method of claim 44 wherein the photosensitizer is present in an amount of from about 0.1% to about 1% by weight of the polyquinoline.

48. A method for forming a photo-patterned polyquinoline-containing dielectric film comprising:

providing a solution comprising a polyquinoline polymer, a diazonaphthoquinone unit and a solvent;

applying a coating of the solution to a substrate;

removing the solvent from the coated solution to thereby form a photoimageable film;

exposing selected areas of the film with light; and developing the exposed film by immersion in a selective solvent which dissolves one of the exposed areas of the film or unexposed areas of the film.

49. The method of claim 48 wherein the selective solvent dissolves unexposed areas of the film.

50. The method of claim 49 wherein the selective solvent is selected from the group consisting of anisole, benzene, chlorobenzene, toluene, xylene, mesitylene, 1,2,4-trimethylbenzene, dioxane, methyl acetate, acetone and mixtures thereof.

51. The method of claim 49 wherein the selective solvent comprises toluene.

52. The method of claim 49 wherein the selective solvent comprises an alkylketone.

53. The method of claim 49 wherein the selective solvent comprises an alkyl amide.

54. The method of claim 48 wherein the wavelength of light is between 230 and 600 nm.

55. The method of claim 48 wherein the wavelength of light is between 300 and 500 nm.

56. The method of claim 48 further comprising washing the developed film with a solvent capable of extracting diazonaphthoquinone unit and photogenerated by-products of diazonaphthoquinone unit for a time sufficient for the solvent to extract at least a portion of the diazonaphthoquinone unit and any photogenerated by-products of the diazonaphthoquinone unit present in the film.

57. A method for forming a photo-patterned polyquinoline-containing dielectric film, comprising the steps of:

exposing selected areas of said photoimageable film formed by the method of claim 20 with light, to form an exposed film; and developing the exposed film by immersion in a selective solvent which dissolves one of (a) exposed areas of the film or (b) unexposed areas of the film.

58. The composition of claim 1 further comprising a solvent so as to form a solution.

59. The composition of claim 1 which consists essentially of the polyquinoline polymer and the diazonaphthoquinone unit.

60. The composition of claim 1 which is a negative photoimageable composition.

* * * * *